United States Patent [19]

Yu et al.

[11] Patent Number: 5,258,951

[45] Date of Patent: Nov. 2, 1993

[54] MEMORY HAVING OUTPUT BUFFER ENABLE BY LEVEL COMPARISON AND METHOD THEREFOR

[75] Inventors: Ruey J. Yu; Kenneth W. Jones; Ray Chang; Karl Wang, all of Austin, Tex.

[73] Assignee: Motorola, Inc., Schaumburg, Ill.

[21] Appl. No.: 919,428

[22] Filed: Jul. 27, 1992

[51] Int. Cl.$^5$ .............................. G11C 7/00
[52] U.S. Cl. .................. 365/189.05; 365/189.02; 365/233; 365/177
[58] Field of Search ............. 365/189.02, 189.05, 365/233, 177; 307/571, 268, 455

[56] References Cited

U.S. PATENT DOCUMENTS

| | | | |
|---|---|---|---|
| 3,760,194 | 9/1973 | Lutz et al. | 307/530 |
| 4,467,455 | 8/1984 | Sood | 365/233 |
| 4,763,303 | 8/1988 | Flannagan | 365/233 |

*Primary Examiner*—Eugene R. LaRoche
*Assistant Examiner*—Andrew Tran
*Attorney, Agent, or Firm*—Daniel D. Hill

[57] ABSTRACT

A memory (20) has a read cycle and a write cycle. During the read cycle, differential data signals, corresponding to data provided by a selected memory cell, are superimposed on a first common mode voltage and provided to data output buffers (70-73). During the write cycle, differential data signals on read global data lines (61-62) are equalized at a second common mode voltage and data output buffers (70-73) are disabled. Output enable circuit (74) provides an output enable signal halfway between the first and second common mode voltages. Data output buffers (70-73) are enabled at the beginning of the read cycle when the differential data signals cross the output enable signal as they transition from the second common mode voltage to the first common mode voltage. Enabling data output buffers (70-73) in this way greatly relaxes output enable timing constraints.

20 Claims, 4 Drawing Sheets

MEMORY HAVING OUTPUT BUFFER ENABLE BY LEVEL COMPARISON AND METHOD THEREFOR

CROSS-REFERENCE TO RELATED, COPENDING APPLICATION

A related, copending application, entitled "A BICMOS Sense Circuit For Sensing Data During a Read Cycle of a Memory", by Scott G. Nogle et al., Ser. No. 07/577,375, was filed on Sep. 4, 1990, and assigned to the assignee hereof.

FIELD OF THE INVENTION

This invention relates generally to integrated circuit memories, and more particularly, to integrated circuit memories having output buffer enable by level comparison.

BACKGROUND OF THE INVENTION

An integrated circuit memory, such as a static random access memory (SRAM), is generally implemented as an array of memory cells in a plurality of rows and columns. An array may be subdivided into blocks of memory cells. The memory cells are addressable through block, row, and column decoders for reading data from the memory cells or writing data into the memory cells. Each memory cell has a unique address at an intersection of a row and a column. The bit line pairs are commonly used for both reading data from, and writing data into, the memory cell. Typically, data is read from memory when a write enable signal is at a logic high (or inactive), and written into memory when the write enable signal is at a logic low, (or active).

During a read cycle, a word line selects the addressed row of memory cells, and a pair of complementary bit lines communicate the data bit between the addressed row and a sense amplifier. The data exists as a relatively small differential voltage on the pair of complementary bit lines. The differential voltage on the bit line pairs may be as little as 80 millivolts. The column address determines which sense amplifier detects and amplifies the differential voltage and communicates it to a read global data line pair. The read global data line pair then carries the data to the output multiplexers, where it is directed to an output buffer/driver and on to the data pad. The output buffer/driver converts the data bit from a differential signal to a single-ended signal and drives the output data pad to the correct output logic level, depending on which logic family is used.

There are various logic families available from which to choose when designing an integrated circuit memory. Each logic family has advantages and disadvantages. ECL (emitter-coupled logic) is one logic family that uses bipolar transistors. CMOS is another type of integrated circuit logic, however CMOS uses complementary MOSFET (metal-oxide semiconductor field-effect transistor) transistors. ECL circuits have the advantage of high speed, but they consume a large amount of power. CMOS logic circuits have the advantages of low power dissipation, high input resistance, low output resistance, and low noise generation. For an ECL circuit, the swing between high and low logic states is only about one base-emitter diode voltage drop ($V_{EE}$). In contrast, CMOS logic states may swing the full rail of the power supply voltage. BICMOS circuits are constructed by including bipolar transistors and CMOS transistors on the same integrated circuit. Therefore, a BICMOS logic circuit can operate at high speed without consuming a large amount of power.

When a memory using ECL as the logic family for the output signal is in a write cycle, some of the data output circuitry, including the data output buffers and sense amplifiers, are disabled and the differential data signals are equalized at a predetermined voltage level. When entering a read cycle from a write cycle, (sometimes called a first read, or a write recovery read) the data output circuits have to be reactivated. The data output buffers are reactivated by an output enable signal that is provided when the write enable signal becomes inactive (beginning a read cycle).

A conventional data output buffer includes a differential amplifier for receiving differential data signals and for providing a single-ended data output signal. A wired-OR connected input transistor for receiving the output enable signal may also be included. During the write cycle, the differential amplifier is disabled by providing the output enable signal to the base of the wired-OR connected input transistor at a voltage higher than the equalized differential data signals. This causes the current in the differential amplifier to be steered through the wired-OR connected transistor, thus causing the single-ended data output signal to be provided at a predetermined voltage, usually determined by the specification requirements. The conventional method of enabling the data output buffers during a write cycle to read cycle transition is to decrease the output enable signal below the lowest voltage of the pair of differential data signals so that no current is steered through the wired-OR connected transistor. The data output buffers are enabled when the output enable signal decreased below the voltage of the differential data signals. If the output enable signal is decreased too soon, a single-ended data signal is provided before a valid differential data signal is received by the data output buffer. Since differential data signals may still be equalized, the voltage level of the single-ended data signal may drift to the midpoint of the ECL output level, and then be driven to a ECL logic high or ECL logic low. This drifting greatly increases to the output rise time and may be undesirable in some applications. If the output enable signal is provided later, to ensure that valid differential data signals are presented to the data output buffer, undesirable access time delay may occur. Therefore, the timing of the output enable signal is very important.

The conventional method for ensuring the correct timing of the output enable signal is to simply adjust the propagation delay of the output enable signal until it arrives at the data output buffer at the correct time. That is, the effective lengths of the signal paths are determined to ensure that the output enable signal arrives to enable the output buffer at the proper time, just before the data signal arrives. But, as integrated circuit memories become larger and faster, adjusting the timing of the various signals within the memory becomes increasingly difficult.

SUMMARY OF THE INVENTION

Accordingly, there is provided, in one form, an integrated circuit memory having a write cycle and a read cycle. The write cycle is indicated by a write enable signal being in a first logic state, for writing data into a selected memory cell via a selected bit line pair. The read cycle is indicated by the write enable signal being in a second logic state, for reading data provided onto a selected bit line pair. A first common mode voltage is provided in response to the write enable signal being in the first logic state. A second common mode voltage is provided when the write enable signal is in the second logic state. A control portion provides an output enable signal at a first voltage level when the write enable signal is in the first logic state. The control portion also provides an output enable signal at a second voltage level, that is characterized as being between the first and second common mode voltages, when the write enable signal is in the second logic state. A data output buffer receives the first common mode voltage and the write enable signal at the first voltage level, and provides a single-ended output signal at a third voltage level. The data output buffer also receives first and second data signals corresponding to data from a selected memory cell. The first and second data signals are characterized as being relatively small complementary data signals superimposed on the second common mode voltage. The data output buffer receives the first and second differential signals superimposed on the second common mode voltage and the output enable signal at the second voltage level, and provides a single-ended output data signal corresponding to said first and second data signals. These and other features and advantages will be more clearly understood from the following detailed description taken in conjunction with the accompanying drawings.

DESCRIPTION OF A PREFERRED EMBODIMENT

Figure 1:
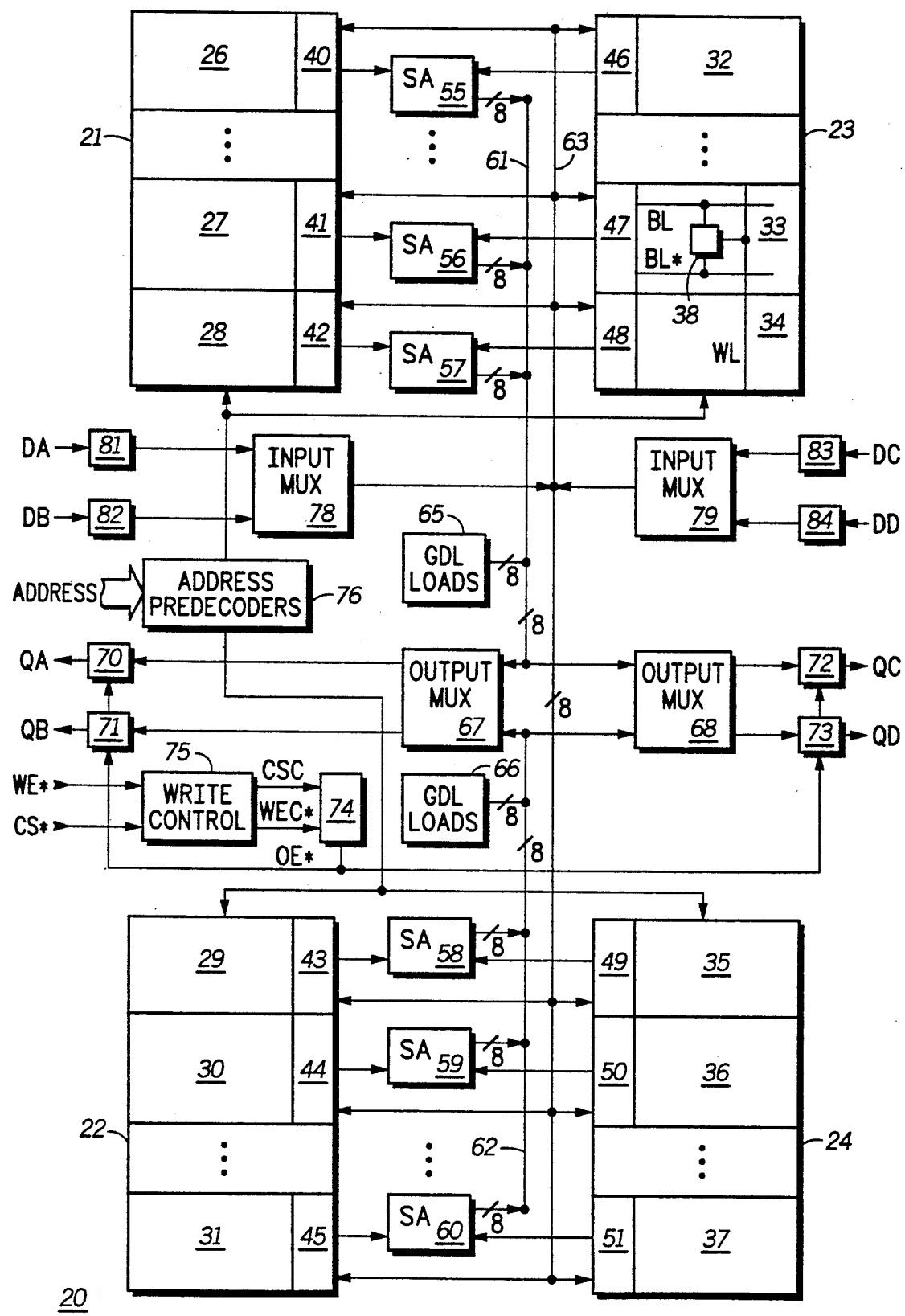
FIG. 1 illustrates in block diagram form an integrated circuit memory in accordance with the present invention.

FIG. 1 illustrates in block diagram form memory 20 in accordance with the present invention. Memory 20 includes quadrants of memory blocks 21-24, memory blocks 26-37, sense amplifier sections 55-60, read global data line pairs 61 and 62, write global data line pairs 63, global data line loads 65 and 66, data output multiplexers 67 and 68, data output buffers 70-73, output enable circuit 74, write control circuit 75, address predecoders 76, data input multiplexers 78 and 79, and data input buffers 81-84. Quadrant of memory blocks 21 includes memory blocks 26-28. Quadrant of memory blocks 22 includes memory blocks 29-31. Quadrant of memory blocks 23 includes memory blocks 32-34. Quadrant of memory blocks 24 includes memory blocks 35-37. In a preferred embodiment, each of the quadrants of memory blocks 21-24 includes sixteen memory blocks. However, the number of memory blocks in each quadrant of memory blocks 21-24 is of no particular significance and can be any number. Therefore, for the purpose of simplicity, only three memory blocks are illustrated in each quadrant of memory blocks 21-24.

Memory block 26 includes bit line load 40. Memory block 27 includes bit line load 41. Memory block 28 includes bit line load 42. Memory block 29 includes bit line load 43. Memory block 30 includes bit line load 44. Memory block 31 includes bit line load 45. Memory block 32 includes bit line load 46. Memory block 33 includes bit line load 47. Memory block 35 includes bit line load 49. Memory block 36 includes bit line load 50. Memory block 37 includes bit line load 51. Illustrated in memory block 33 is a representative memory cell 33. Memory cell 33 is coupled to bit lines labeled "BL" and "BL*", and to a word line labeled "WL". In the illustrated embodiment, each memory block includes 128 bit line pairs BL and BL* and 512 word lines WL, with memory cells located at the intersections of the bit line pairs and the word lines. Memory 20 is commonly known as a 4M SRAM. Each bit line pair serves as an input to the memory cells during the write cycle of memory 20 and as an output during the read cycle.

Figure 2:
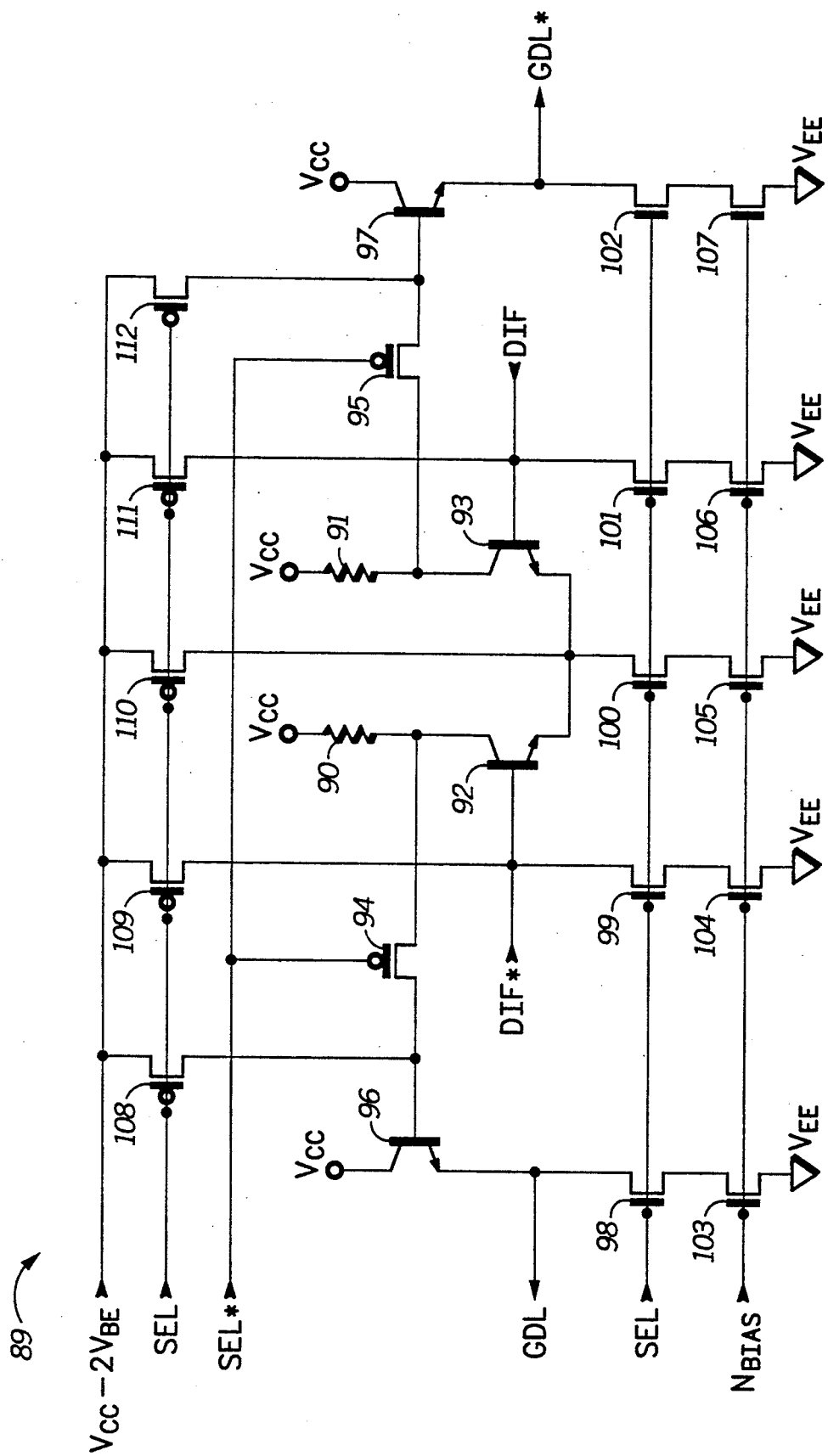
FIG. 2 illustrates in schematic diagram form a sense amplifier circuit in accordance with the present invention.

Sense amplifier section 55 is coupled to memory block 26 and memory block 32. Sense amplifier section 56 is coupled to memory block 27 and memory block 33. Sense amplifier section 57 is coupled to memory block 28 and memory block 34. Sense amplifier section 58 is coupled to memory block 29 and memory block 35. Sense amplifier section 59 is coupled to memory block 30 and memory block 36. Sense amplifier section 60 is coupled to memory block 31 and memory block 37. Each sense amplifier section can sense and amplify data signals from each of the two memory blocks to which it is coupled. Included in each sense amplifier section 55-60 are eight sense amplifier circuits. Sense amplifier circuit 89 is representative of one of the eight sense amplifier circuits, and is illustrated in FIG. 2.

Sense amplifier sections 55, 56, and 57 are coupled to eight read global data line pairs 61 and sense amplifier sections 58, 59, and 60 are coupled to eight read global data line pairs 62. Read global data line pairs 61 carry differential data signals from sense amplifier sections 55, 56, and 57 to data output multiplexers 67 and 68 during a read cycle of memory 20. Likewise, read global data line pairs 62 carry differential data signals from sense amplifier sections 58, 59, and 60 to data output multiplexers 67 and 68. Eight write global data line pairs 63 carry differential data signals from data input multiplexers 78 and 79 to memory blocks 26-37 during a write cycle of memory 20.

A single-ended data signal labeled "DA" is provided to data input buffer 81 and a single-ended data signal labeled "DB" is provided to input buffer 82 during a write cycle of memory 20. Data input buffers 81 and 82 provide single-ended CMOS level data signals corresponding to single-ended data signals DA and DB, respectively, to data input multiplexer 78. Also, single-ended data signals labeled "DC" and "DD" are provided to data input buffers 83 and 84, respectively. Data input buffers 83 and 84 provide corresponding single-ended CMOS level data signals to input multiplexer 79.

During a read cycle, data output multiplexer 67 provides data signals to data output buffers 70 and 71 corresponding to the differential data signals provided by read global data line pairs 61 and 62. Data output buffers 70 and 71 then provide corresponding single-ended data signals labeled "QA" and "QB", respectively. Data output buffers 72 and 73 receive differential data signals provided by output multiplexer 68 and provide corresponding single-ended data signals labeled "QC" and "QD", respectively.

Address signals labeled "ADDRESS" are provided to address predecoders 76. Address predecoders 76 provide predecoded quadrant, row, column, and block addresses for selecting which memory cell is to receive data during a write cycle of memory 20, and also which memory cell is to provide data during a read cycle of memory 20.

There are 128 memory cells coupled to each word line. Each memory cell that is coupled to the selected word line provides its output as a differential voltage on a corresponding bit line pair. Predecoded address signals are provided to column decoders and row selects (not shown). For a word width of X1, a column decoder of memory block 28 selects one bit line pair of the 128 bit line pairs. When a bit line pair is selected, a sense amplifier then senses and amplifies the relatively small differential voltage provided to the bit line pair by the memory cell and couples the selected bit line to a read global data line pair. The differential voltage provided to the bit line pair during a read cycle is approximately 80 millivolts. During a write cycle, the bit lines are driven, via the write global data line pairs to approximately CMOS level signals in order to write into the memory cell. The sense amplifier is deselected during a write cycle.

In the illustrated embodiment, memory 20 can be configured with a word width, or data organization of X1, X2, or X4. For a word width of X1, only one data output buffer and one data input buffer is needed. For a word width of X2, two data output buffers and two data input buffers are needed. For a word width of X4, all of the data output buffers and all of the data input buffers are used. If the word width is X1, memory 20 receives 22 address signals, A0-A21. An address buffer (not shown) provides column address signals A0-A3, block address signals A4-A7, row address signals A8-A16, quad address signals A17 and A18 to select one of the four quadrants of memory blocks, and X1 option address signals A19-A21. If the word width is X2, address signal A21 is not needed. And if the word width is X4, address signals A20 and A21 are not needed. Memory 20 can also be configured for a word width of X8, if additional data output buffers and data input buffers are provided.

Write control circuit 75 receives an ECL (emitter-coupled logic) level external write enable signal labeled "WE*" and an ECL level external chip select signal labeled "CS*". In response, write control circuit 75 provides an internal write enable signal labeled "WEC*" and an internal chip select signal labeled "CSC". Internal write enable signal WEC* and internal chip select signal CSC are provided to output enable circuit 74 at CMOS levels. Output enable circuit 74 provides output enable signal OE* at $V_{CC}-V_{BE}$ during a write cycle, and at $V_{CC}-2.5V_{BE}$ during a read cycle, to each of data output buffers 70-73.

To read data from memory 20, write control circuit 75 receives external chip select signal CS* as an ECL logic low (active), and external write enable signal WE* as an ECL logic high (inactive). Note that an asterisk (*) after the signal name indicates that the signal is active at a logic low. Internal write enable signal WEC* and internal chip select signal CSC are buffered from write enable signal WE* and chip select signal CS*, respectively. An address is provided by address predecoders 76 to select a memory block and one of the 512 word lines. Only one memory block can be selected at a time. Each memory cell that is coupled to the selected word line provides its output as a differential voltage on a corresponding bit line pair. For a word width of X4, the address selects four pairs of the 128 bit line pairs. When the bit line pairs are selected, sense amplifier circuits of the selected block sense and amplify the relatively small differential voltage provided to the bit line pairs by the memory cells and couples the selected bit lines to read global data line pairs. All of the other sense amplifier circuits are deactivated.

Output enable circuit 74 provides output enable signal OE* to enable output buffers 70, 71, 72, and 73. Data output multiplexer 67 or 68 receives differential signals from read global data line pairs 61 and 62, corresponding to differential signals from bit line pairs, and provides data signals to each of output buffers 70, 71, 72, or 73. Single-ended data signals QA, QB, QC, and QD, are provided by output buffers 70, 71, 72, and 73, respectively.

During a write cycle, the flow of data is essentially reversed from the read cycle. To write data into memory 20, chip select signal CS* is a logic low (active), and write enable signal WE* is a logic low (active). Output enable signal OE* is provided by output enable circuit 74, which disables data output buffers 70-73. Output enable signal OE* will be discussed later. Single-ended data signals are provided to data input buffers 81-84, which in turn provides the data bits as single-ended data signals to input multiplexers 78 and 79. Input multiplexers 78 and 79 provide corresponding differential data signals to write global data line pairs 63. As in the read cycle, memory cells located on an enabled word line provide data to bit line pairs. However, a voltage differential driven onto a bit line pair is greater than the drive voltage of the memory cell and overwrites a stored bit in the memory cell. The differential voltage driven onto the bit line pairs during the write cycle of memory 20 is high enough to over-write the contents of the memory cell. This differential voltage can be provided at full CMOS levels. At the end of a write cycle the differential voltage on the bit line pairs must be reduced to a level small enough so that the data is not erroneously written into a memory cell during the following read cycle. This is known as write recovery. Write recovery of the bit line pairs is achieved by bit line loads 40-51.

FIG. 2 illustrates in schematic diagram form sense amplifier circuit 89 in accordance with the present invention. Sense amplifier circuit 89 includes resistors 90 and 91, NPN transistors 92, 93, 96, and 97, P-channel transistors 94 and 95, N-channel transistors 98-107, and P-channel transistors 108-112. Resistor 90 has a first terminal connected to a positive power supply voltage terminal labeled "$V_{CC}$" and a second terminal. Resistor 91 has a first terminal connected to $V_{CC}$ and a second terminal. NPN transistor 92 has a collector connected to the second terminal of resistor 90, a base for receiving a data signal labeled "DIF*", and an emitter. NPN transistor 93 has a collector connected to the second terminal of resistor 91, a base for receiving a data signal labeled "DIF", and an emitter connected to the emitter of transistor 92. P-channel transistor 94 has a first drain/source terminal connected to the collector of transistor 92, a gate for receiving a select signal labeled "SEL*", and a second drain/source terminal. P-channel transistor 95 has a first drain/source terminal connected to the collector of transistor 93, a gate for receiving select signal SEL*, and a second drain/source terminal. NPN transistor 96 has a collector connected to $V_{CC}$, a base connected to the second drain/source terminal of transistor 94 and an emitter for providing a data signal labeled "GDL". NPN transistor 97 has a collector connected to $V_{CC}$, a base connected to the second drain/source terminal of transistor 95 and an emitter for providing a data signal labeled "GDL*".

N-channel transistor 98 has a drain connected to the emitter of transistor 96, a gate for receiving a select signal labeled "SEL", and a source. N-channel transistor 99 has a drain connected to the base of transistor 92, a gate for receiving select signal SEL, and a source. N-channel transistor 100 has a drain connected to the emitters of transistors 92 and 93, a gate for receiving select signal SEL, and a source. N-channel transistor 101 has a drain connected to the base of transistor 93, a gate for receiving select signal SEL, and a source. N-channel transistor 102 has a drain connected to the emitter of transistor 97, a gate for receiving select signal SEL, and a source. N-channel transistor 103 has a drain connected to the source of transistor 98, a gate for receiving a bias voltage labeled "$N_{BIAS}$", and a source connected to a negative power supply voltage terminal labeled "$V_{EE}$". N-channel transistor 104 has a drain connected to the source of transistor 99, a gate for receiving bias voltage $N_{BIAS}$, and a source connected to $V_{EE}$. N-channel transistor 105 has a drain connected to the source of transistor 100, a gate for receiving bias voltage $N_{BIAS}$, and a source connected to $V_{EE}$. N-channel transistor 106 has a drain connected to the source of transistor 101, a gate for receiving bias voltage $N_{BIAS}$, and a source connected to $V_{EE}$. N-channel transistor 107 has a drain connected to the source of transistor 102, a gate for receiving bias voltage $N_{BIAS}$, and a source connected to $V_{EE}$.

P-channel transistor 108 has a source for receiving a voltage labeled "$V_{CC}-2V_{BE}$", a gate for receiving select signal SEL, and a drain connected to the base of transistor 96. P-channel transistor 109 has a source for receiving voltage $V_{CC}-2V_{BE}$, a gate for receiving select signal SEL, and a drain connected to the base of transistor 92. P-channel transistor 110 has a source for receiving voltage $V_{CC}-2V_{BE}$, a gate for receiving select signal SEL, and a drain connected to the emitters of transistors 92 and 93. P-channel transistor 111 has a source for receiving voltage $V_{CC}-2V_{BE}$, a gate for receiving select signal SEL, and a drain connected to the base of transistor 93. P-channel transistor 112 has a source for receiving voltage $V_{CC}-2V_{BE}$, a gate for receiving select signal SEL, and a drain connected to the base of transistor 97.

N-channel transistors 103-107 provide constant current sources. Bias voltage $N_{BIAS}$ is provided by a conventional $N_{BIAS}$ voltage generator. Select signals SEL and SEL* are differential select signals for selecting and deselecting sense amplifier circuit 89. Input signals DIF and DIF* are differential input signals corresponding to the differential signals received from a single selected bit line pair. The voltage difference between DIF and DIF* is relatively small, (approximately 80 millivolts). Sense amplifier circuit 89 is representative of the other sense amplifier circuits included in memory 20.

During a read cycle, sense amplifier circuit 89 is selected to sense and amplify a differential signal from a bit line pair. Select signal SEL is a logic high, causing P-channel transistors 108-112 to be non-conductive and N-channel transistors 98-102 to be conductive. Select signal SEL* is therefore a logic low, causing P-channel transistors 94 and 95 to be conductive, coupling the base of transistor 96 to the second terminal of resistor 90 and the base of transistor 97 to the second terminal of resistor 91. When selected, sense amplifier circuit 89 operates in a conventional manner for an amplifier having emitter-follower outputs. Data signals GDL and GDL* are provided to a read global data line pair of read global data line pairs 61 of FIG. 1. If data signal DIF is a higher voltage than data signal DIF*, transistor 93 is more conductive than transistor 92, so that a current designated as $I_{105}$ is steered through transistor 93. The voltage at the collector of transistor 93 is equal to $V_{CC}-I_{105}R_{91}$, where $R_{91}$ is the resistance of resistor 91. The voltage at the collector of transistor 92 is equal to $V_{CC}$, since substantially no current flows through transistor 92. The voltage of data signal GDL is therefore equal to $V_{CC}-V_{BE}$, where $V_{BE}$ is equal to one base-emitter diode voltage drop (about 0.8 volts). The voltage of data signal GDL* is equal to $V_{CC}-V_{BE}-I_{105}R_{90}$. If the logic states are changed so that the voltage of data signal DIF is lower than the voltage of DIF*, transistor 93 becomes less conductive than transistor 92, so that current $I_{105}$ is steered through transistor 92. Data signal GDL is then equal to $V_{CC}-V_{BE}-I_{105}R_{90}$, where $R_{90}$ represents the resistance of resistor 90, and GDL* is equal to $V_{CC}-V_{BE}$. The common mode voltage of data signals GDL and GDL*, when sense amplifier circuit 89 is selected, is therefore equal to about $V_{CC}-V_{BE}$ and the voltage differential between data signals GDL and GDL* is equal to the voltage drop across either resistor 90 or resistor 91, or about 300 millivolts.

To deselect sense amplifier circuit 89, select signal SEL is a logic low, causing N-channel transistors 98-102 to be non-conductive, isolating N-channel transistors 103-107 from NPN transistors 92, 93, 96, and 97, and resulting in substantially no current flow through sense amplifier circuit 89. Also, P-channel transistors 108-112 are conductive, providing a voltage equal to $V_{CC}-2V_{BE}$ to the bases of transistors 92, 93, 96, and 97. Providing voltage $V_{CC}-2V_{BE}$ to bases of transistors 92, 93, 96, and 97 and to the emitters of transistors 92 and 93 prevents a base-emitter reverse-biasing problem. When SEL* is a logic high, P-channel transistors 94 and 95 are non-conductive. P-channel transistors 108 and 112 are conductive and providing voltage $V_{CC}-2V_{BE}$ to the bases of transistors 96 and 97. Therefore, transistors 96 and 97 cannot be biased into conduction until SEL* is a logic low, thus providing sense amplifier 89 with a wired-OR capability.

The base-emitter voltage of transistors 96 and 97 is determined to provide an adequate noise margin without subjecting transistors 96 and 97 to excessive base-emitter reverse biasing, and to give sense amplifier circuit 89 a wired-OR capability so that a plurality of sense amplifier circuits 89 can share the same global data line pair. To ensure a large noise margin, it is desirable to reduce the voltage at the bases of transistors 96 and 97 very close to $V_{EE}$. But that may cause transistors 96 and 97 to be reverse-biased beyond the acceptable reverse-bias limit established as $-2.5$ volts. To insure an adequate noise margin without excessive reverse-bias, the bases of transistors 96 and 97 are pulled to a common mode voltage of $V_{CC}-2V_{BE}$ when sense amplifier 89 is deselected. Voltage $V_{CC}-2V_{BE}$ is one $V_{BE}$ below the common mode voltage level of read global data line pairs 61 and 62 during a read cycle, thus providing a noise margin of about one $V_{BE}$, while preventing transistors 96 and 97 from being reverse-biased below −2.5 volts. Only one sense amplifier circuit can provide data to a global data line pair at a time.

Figure 3:
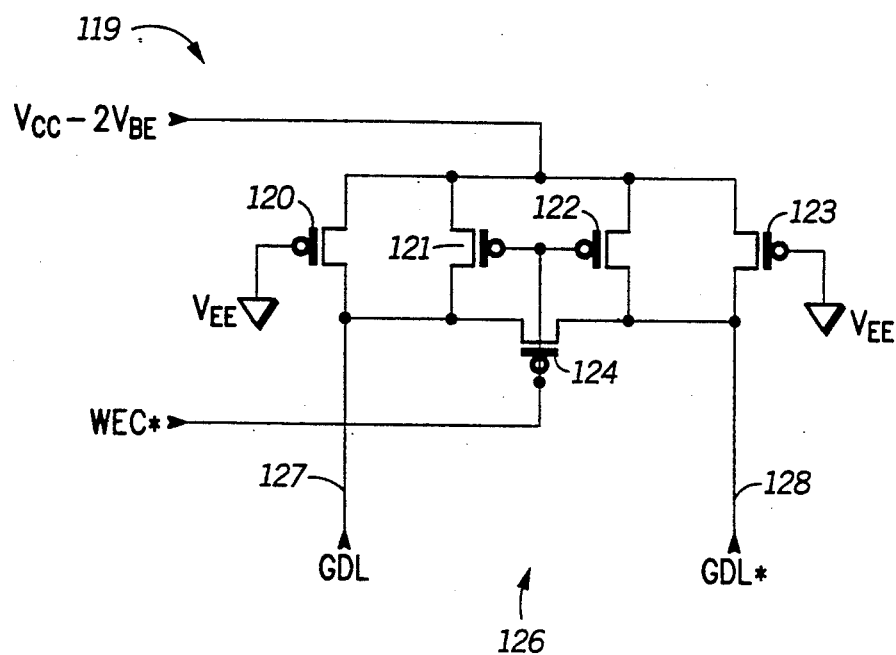
FIG. 3 illustrates in schematic diagram form a GDL load of the memory of FIG. 1 in accordance with the present invention.

FIG. 3 illustrates in schematic diagram form GDL load circuit 119 of GDL loads 65 of FIG. 1 in accordance with the present invention. GDL load circuit 119 is one of eight GDL load circuits of GDL load 65. GDL load 119 is coupled to read global data line pair 126. Read global data line pair 126 includes read global data line 127 and read global data line 128. A GDL load circuit similar to GDL load circuit 119 is coupled to each read global data line pair of read global data line pairs 61 and 62. GDL load 66 of FIG. 1 also includes eight GDL load circuits similar to GDL load circuit 119.

GDL load 119 includes P-channel transistors 120–124. P-channel transistor 120 has a source for receiving voltage $V_{CC}$-2$V_{BE}$, a gate connected to $V_{EE}$, and a drain connected to read global data line 127. P-channel transistor 121 has a source connected to the source of transistor 120, a gate for receiving internal write enable signal WEC*, and a drain connected to the drain of transistor 120. P-channel transistor 122 has a source connected to the source of transistor 121, a gate connected to the gate of transistor 121, and a drain connected to read global data line 128. P-channel transistor 123 has a source connected to the source of transistor 122, a gate connected to $V_{EE}$, and a drain connected to the drain of transistor 122. P-channel transistor 124 has a first source/drain terminal connected to the drains of transistors 120 and 121, a gate for receiving internal write enable signal WEC*, and a second source/drain terminal connected to the drains of transistors 122 and 123.

P-channel transistors 120 and 123 are a relatively small size, providing a weak conductive path between voltage $V_{CC}$-2$V_{BE}$ and read global data line pair 126. During a write cycle, internal write enable signal WEC* is provided to the gates of transistors 121, 122, and 124 as a logic low, causing them to be conductive. Transistors 121 and 122 are larger than transistors 120 and 123, providing for a more conductive path for voltage $V_{CC}$-2$V_{BE}$. When conductive, transistor 124 couples read global data line 127 to read global data line 128, ensuring that their voltages are equalized at a common mode voltage of $V_{CC}$-2$V_{BE}$ during a write cycle of memory 20.

During a read cycle of memory 20, internal write enable signal WEC* is provided as a logic high voltage to the gates of transistors 121, 122, and 124, causing them to become non-conductive. Transistors 120 and 123 remain conductive, however, a selected sense amplifier coupled to read global data line pair 126 can still drive read global data line pair 126 to a common mode voltage of $V_{CC}$-$V_{BE}$. Read global data line pair 126 can then provide differential data signals GDL and GDL*, corresponding to data signals DIF and DIF*, to data output multiplexer 67 or 68.

Figure 4:
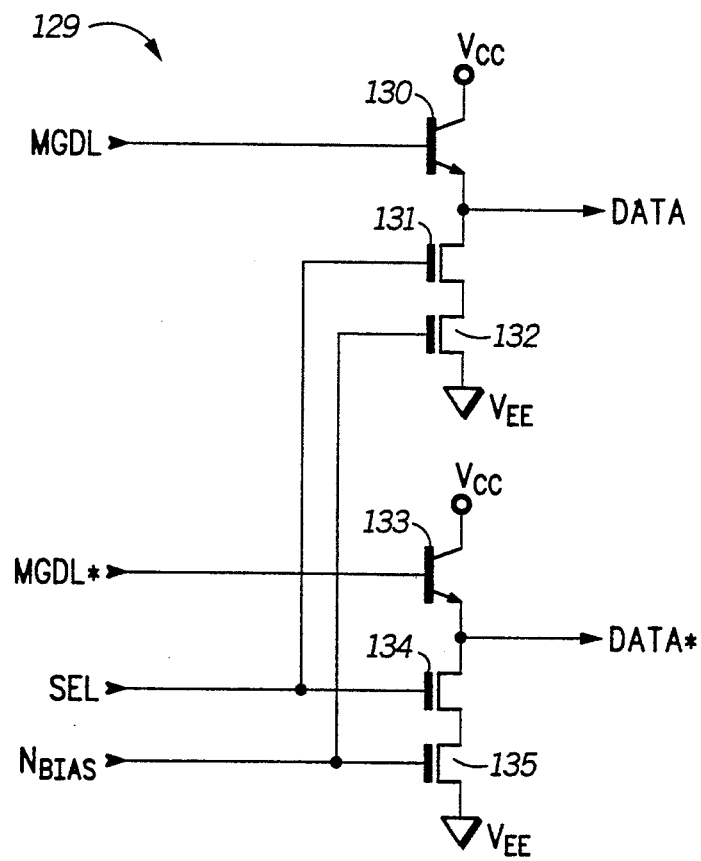
FIG. 4 illustrates in partial logic diagram form and partial schematic diagram form a data output multiplexer emitter-follower portion of the memory of FIG. 1 in accordance with the present invention.

FIG. 4 illustrates in partial logic diagram form and partial schematic diagram form, data output multiplexer emitter-follower portion 129 of data output multiplexer 67 of memory 20 of FIG. 1 in accordance with the present invention. Data output multiplexer emitter-follower portion 129 is one of eight data output multiplexer emitter-follower portions located in data output multiplexer 67. Data output multiplexer 68 also includes eight data output multiplexer emitter-follower portions similar to data output multiplexer emitter-follower portion 129.

Data output multiplexer emitter-follower portion 129 includes NPN transistors 130 and 133 and N-channel transistors 131, 132, 134, and 135. NPN transistor 130 has a collector connected to $V_{CC}$, a base for receiving data signal MGDL, and an emitter for providing a data signal labeled "DATA". N-channel transistor 131 has a drain connected to the emitter of transistor 130, a gate for receiving select signal SEL, and a source. N-channel transistor 132 has a drain connected to the source of transistor 131, a gate for receiving bias voltage $N_{BIAS}$, and a source connected to $V_{EE}$. NPN transistor 133 has a collector connected to $V_{CC}$, a base for receiving data signal MGDL*, and an emitter for providing a data signal labeled "DATA*". N-channel transistor 134 has a drain connected to the emitter of transistor 133, a gate connected to the gate of transistor 131 for receiving select signal SEL, and a source. N-channel transistor 135 has a drain connected to the source of transistor 134, a gate connected to the gate of transistor 132 for receiving bias voltage $N_{BIAS}$, and a source connected to $V_{EE}$.

Data output multiplexer emitter-follower portion 129 receives differential data signals MGDL and MGDL* from data output multiplexer 67, and provides corresponding differential data signals DATA and DATA*. Differential data signals MGDL and MGDL* are provided at approximately the same common mode voltage levels as differential data signals GDL and GDL*. Transistors 130 and 133 reduce the common mode voltage levels of differential data signals DATA and DATA* one base-emitter diode voltage drop below the common mode voltage levels of differential data signals MGDL and MGDL*. That is, during a write cycle, the common mode voltage of differential data signals MGDL and MGDL* is approximately $V_{CC}$-2$V_{BE}$. Differential data signals MGDL and MGDL* are held at a common mode voltage of $V_{CC}$-2$V_{BE}$ during a write cycle of memory 20 to prevent excessive base-emitter reverse biasing of transistors 96 and 97 of sense amplifier circuit 89 of FIG. 2, and to prevent the access time of memory 20 from increasing because of power supply induced noise on read global data line pairs 61 and 62. Transistors 130 and 133 reduce the common mode voltage of differential data signals DATA and DATA* by one $V_{BE}$, respectively. The common mode voltage of differential data signals DATA and DATA* during a write cycle is therefore equal to $V_{CC}$-3$V_{BE}$. During a read cycle, the common mode voltage of differential data signals DATA and DATA* is equal to $V_{CC}$-2$V_{BE}$. Data output multiplexer emitter-follower portions similar to data output multiplexer emitter-follower portion 129 are also provided for data output multiplexer 68 of FIG. 1.

During a write cycle of memory 20, data output multiplexer 67 and 68 illustrated in FIG. 1 are idle. Therefore, to reduce the current flow through NPN transistors 130 and 133, select signal SEL is provided to the gates of transistor 131 and 134 at a voltage low enough to cause transistors 131 and 134 to be non-conductive. During a read cycle of memory 20, select signal SEL is a logic high, causing transistors 131 and 134 to be conductive. Transistors 132 and 135 are then able to provide current sources for transistors 130 and 133, respectively.

Figure 5:
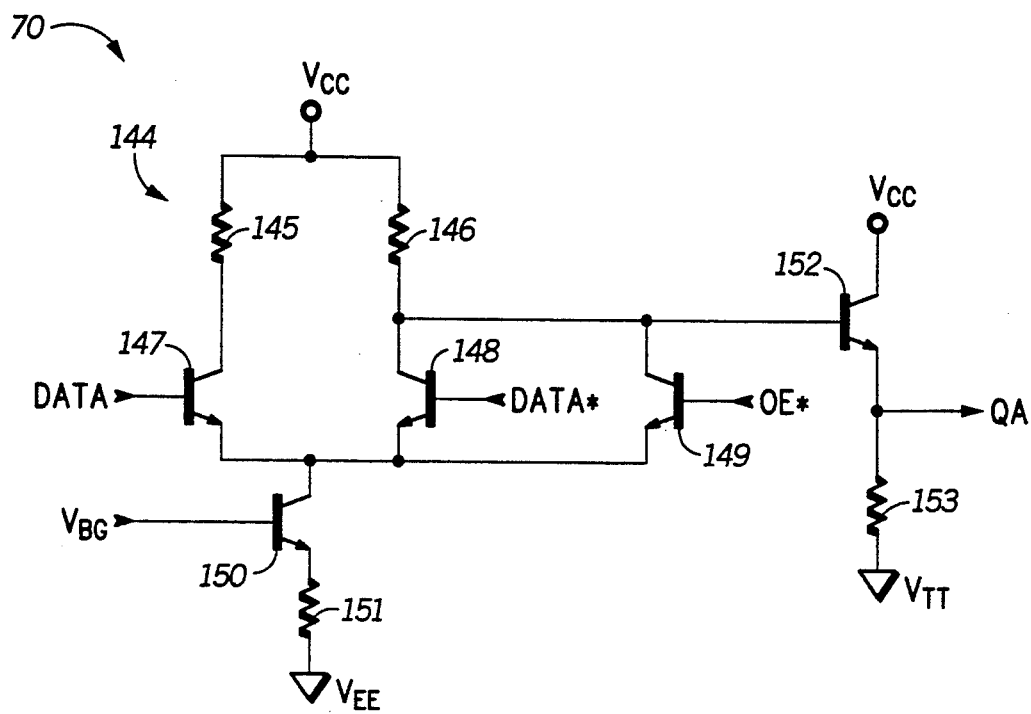
FIG. 5 illustrates in schematic diagram form an output buffer of the memory of FIG. 1 in accordance with the present invention.

FIG. 5 illustrates in schematic diagram form output buffer 70 of memory 20 of FIG. 1 in accordance with the present invention. Output buffer 70 includes resistors 145 and 146, NPN transistors 147, 148, 149, 150, and 152, and resistor 151. External resistor 153 is also illustrated. Resistors 145, 146, and 151 and transistors 147, 148, 149, and 150 form a differential amplifier portion 144. Transistor 152 serves as an emitter-follower output transistor. Resistor 145 has a first terminal connected to $V_{CC}$ and a second terminal. Resistor 146 has a first terminal connected to $V_{CC}$ and a second terminal. NPN transistor 147 has a collector connected to the second terminal of resistor 145, a base for receiving data signal DATA, and an emitter. NPN transistor 148 has a collector connected to the second terminal of resistor 146, a base for receiving data signal DATA*, and an emitter connected to the emitter of transistor 147. NPN transistor 149 has a collector connected to the second terminal of resistor 146, a base for receiving an output enable signal labeled "OE*", and an emitter connected to the emitters of transistors 147 and 148. NPN transistor 150 has a collector connected to the emitters of transistors 147, 148, and 149, a base for receiving bandgap voltage $V_{BG}$, and an emitter. Resistor 151 has a first terminal connected to the emitter of transistor 150 and a second terminal connected to $V_{EE}$. NPN transistor 152 has a collector connected to $V_{CC}$, a base connected to the second terminal of resistor 146, and an emitter for providing a single-ended data signal labeled "QA". External resistor 153 has a first terminal connected to the emitter of transistor 152 and a second terminal connected to a termination voltage terminal labeled "$V_{TT}$". Data output buffers 71, 72, and 73 have the same circuitry, and operate in the same manner, as data output buffer 70.

During a write cycle of memory 20, transistors 147 and 148 receive differential data signals DATA and DATA* equalized at a common mode voltage equal to about $V_{CC}$-3$V_{BE}$. Differential data signals DATA and DATA* are equalized by global data line pair 119 as discussed with FIG. 3. Since the voltage of differential data signals DATA and DATA*, are equalized at a common mode voltage, the bases of transistors 147 and 148 are biased substantially equally. Output enable signal OE* is received by transistor 149 at a voltage equal to $V_{CC}$-$V_{BE}$. A current through transistor 150, designated as $I_{150}$, is steered through transistor 149 so that the voltage at the base of transistor 152 is approximately equal to $V_{CC}$-$I_{150}R_{146}$, where $R_{146}$ is the resistance of resistor 146. The voltage level of single-ended data signal QA during a write cycle is determined by the specification requirement. External resistor 153 and termination voltage terminal $V_{TT}$ are provided for impedance matching purposes. In the preferred embodiment, the resistance of external resistor 153 is equal to about fifty ohms and the voltage at the termination voltage terminal $V_{TT}$ equal to about 2.0 volts below $V_{CC}$. However, other resistance values may be desired for resistor 153, and other voltage levels may be desired at termination voltage terminal $V_{TT}$, depending on the application.

When transitioning from a write cycle to a read cycle, the voltage of output enable signal OE* is decreased from $V_{CC}$-$V_{BE}$ to $V_{CC}$-2.5$V_{BE}$. The common mode voltage of differential data signals DATA and DATA* remains temporally at $V_{CC}$-3$V_{BE}$ at the beginning of the read cycle because of the propagation delay. The common mode voltage of differential data signals DATA and DATA* is then begins to increase to $V_{CC}$-2$V_{BE}$. As the common mode voltage of differential data signals DATA and DATA* increases above $V_{CC}$-2.5$V_{BE}$, transistor 149 becomes less conductive, and transistors 147 and 148 become more conductive. Current $I_{150}$ is steered through either of transistors 147 and 148, depending on the logic state of data signals DATA and DATA*. As the common mode voltage of differential data signals DATA and DATA* increases to $V_{CC}$-2$V_{BE}$, a relatively small differential voltage (approximately 300 millivolts) is superimposed on the common mode voltage to define the logic states of differential data signals DATA and DATA*. For example, if differential data signal DATA is a logic high and data signal DATA* is a logic low, then transistor 147 is more conductive than transistor 148, and current $I_{150}$ flows through transistor 147. In that case, the voltage at the base of transistor 152 is equal to approximately $V_{CC}$, and single-ended data signal QA is equal to an ECL logic high voltage of $V_{CC}$-$V_{BE}$. If differential data signal DATA is a logic low and differential data signal DATA* is a logic high, then current $I_{150}$ flows through transistor 148. In that case, the voltage at the base of transistor 152 is equal to approximately $V_{CC}$-$I_{150}R_{146}$, where $R_{146}$ is equal to the resistance of resistor 146. Resistor 146 is sized to provide about a one $V_{BE}$ voltage drop, thereby providing single-ended data signal QA at an ECL logic low voltage of $V_{CC}$-2$V_{BE}$.

The current source provided by bipolar transistor 150 and resistor 151 "tracks" the temperature and process variations of resistors 145 and 146, and transistor 152, providing for a better noise margin than if an N-channel transistor was used as the current source. Also, bandgap controlled bias voltage $V_{BG}$ provides a very stable bias voltage to the base of transistor 150, improving the voltage stability and the noise margin.

During subsequent read cycles (following the write cycle to read cycle transition), output enable signal OE* remains at $V_{CC}$-2.5$V_{BE}$. Data output buffer 70 remains enabled as long as the common mode voltage of differential data signals DATA and DATA* is at a higher voltage than output enable signal OE*. When the common mode voltage of differential data signals DATA and DATA* decreases below the voltage level of output enable signal OE* (during a write cycle), data output buffer 70 is disabled.

The conventional method of enabling the data output buffers during a write cycle to read cycle transition is to decrease the output enable signal below the lowest common mode voltage of differential data signals DATA and DATA*. The data output buffers are enabled when the output enable signal decreases below the lowest common mode voltage. If the output enable signal is decreased too soon, the single-ended data signal is provided before a differential data signal is received by the data output buffer. Since there is no differential data signal, the voltage level of the single-ended data signal drifts to the midpoint of the ECL output level, and is driven to a ECL logic high or ECL logic low. This greatly increases to the output rise time and is undesirable in some applications. If the output enable signal is provided later, to ensure that valid data has been presented to the data output buffer, undesirable access time delay may occur. Therefore, the timing of the output enable signal is very important.

Providing output enable signal OE* at the midpoint of the read cycle and write cycle common mode voltage levels of differential data signals DATA and DATA* greatly relaxes the timing requirements for enabling the data output buffers at the beginning of a read cycle. After write enable signal WE* changes from a logic low to a logic high (to start a read cycle), output enable signal OE* can be changed from voltage level $V_{CC}-V_{BE}$ to voltage level $V_{CC}-2.5V_{BE}$ immediately, to await the common mode voltage level swing of differential data signals DATA and DATA* from $V_{CC}-3V_{BE}$ to $V_{CC}-2V_{BE}$. Data output buffer 70 will not be enabled until the common mode voltage level of differential data signal DATA and DATA* increases above $V_{CC}-2.5V_{BE}$.

Figure 6:
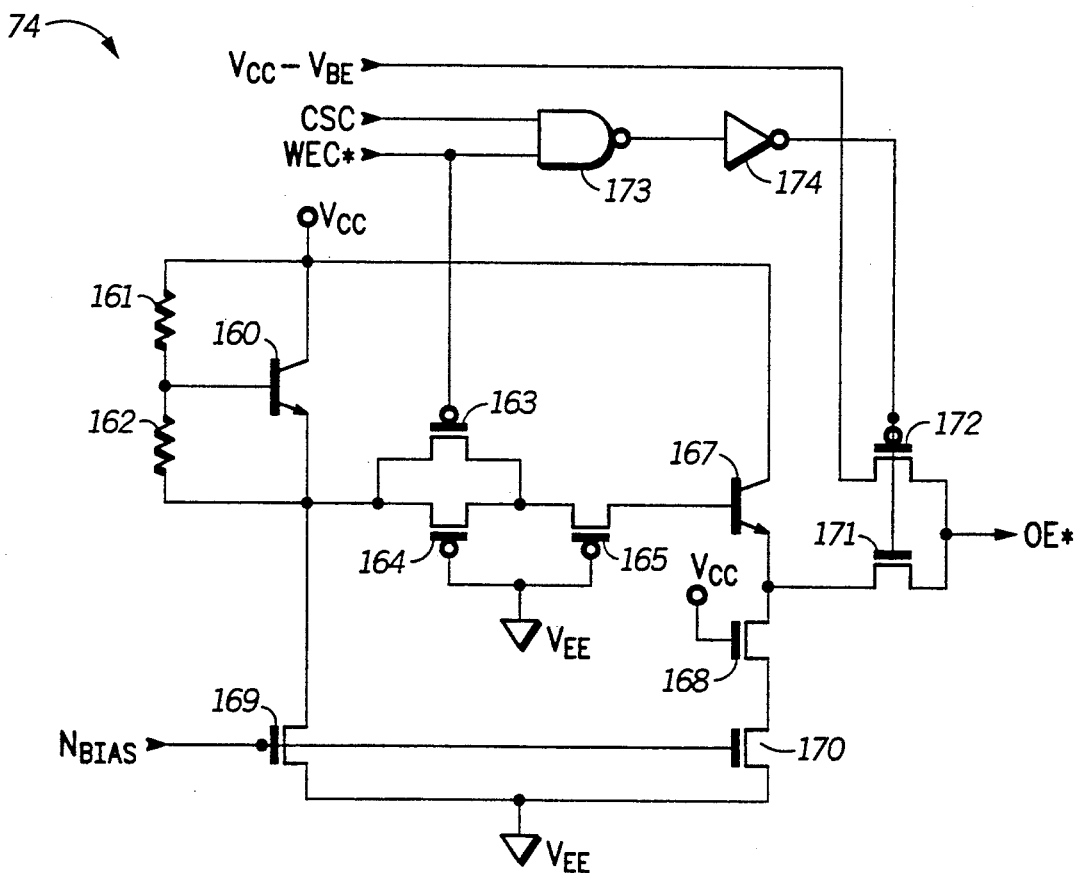
FIG. 6 illustrates in schematic diagram form an output buffer enable circuit of the memory of FIG. 1 in accordance with the present invention.

FIG. 6 illustrates in schematic diagram form output buffer enable circuit 74 of memory 20 of FIG. 1 in accordance with the present invention. Output buffer enable circuit 74 includes resistors 161 and 162, P-channel transistors 163, 164, 165, and 172, NPN transistors 160 and 167, N-channel transistors 168, 169, 170, and 171, NAND gate 173, and inverter 174. Resistor 161 has a first terminal connected to the second terminal of resistor 161 and a second terminal. NPN transistor 160 has a collector connected to $V_{CC}$, a base connected to the second terminal of resistor 161, and an emitter connected to the second terminal of resistor 162. P-channel transistor 163 has a first drain/source terminal connected to the emitter of transistor 160, a gate for receiving internal write enable signal WEC*, and a second drain/source terminal. P-channel transistor 164 has a first drain/source terminal connected to the first drain/source terminal of transistor 163, a gate connected to $V_{EE}$, and a second drain/source terminal connected to the second drain/source terminal of transistor 163. P-channel transistor 165 has a first drain/source terminal connected to the second drain/source terminal of transistors 163 and 164, a gate connected to $V_{EE}$, and a second drain/source terminal. NPN transistor 167 has a collector connected to $V_{CC}$, a base connected to the second drain/source terminal of transistor 165, and an emitter. N-channel transistor 168 has a drain connected to the emitter of transistor 167, a gate connected to $V_{CC}$, and a source. N-channel transistor 169 has a drain connected to the emitter of transistor 160, a gate for receiving bias voltage $N_{BIAS}$, and a source connected to $V_{EE}$. N-channel transistor 170 has a drain connected to the source of transistor 168, a gate for receiving bias voltage $N_{BIAS}$, and a source connected to $V_{EE}$. NAND gate 173 has a first input terminal for receiving internal chip select signal CSC, a second input terminal for receiving internal write signal WEC*, and an output terminal. Inverter 174 has an input terminal connected to the output terminal of NAND gate 173 and an output terminal. N-channel transistor 171 has a first drain/source terminal connected to the emitter of transistor 167, a gate connected to the output terminal of inverter 174, and a second drain/source terminal for providing output enable signal OE*. P-channel transistor 172 has a first drain/source terminal for receiving a voltage labeled "$V_{CC}-V_{BE}$", a gate connected to the gate of transistor 171, and a second drain/source terminal connected to the second drain/source terminal of transistor 171.

When internal chip select signal CSC is a logic high and internal write enable signal WEC* is a logic low, (indicating a write cycle) NAND gate 173 provides a logic high to the input terminal of inverter 174 and in response, a logic low is provided at the output terminal of inverter 174. P-channel transistor 172 is conductive and N-channel transistor 171 is non-conductive, so that output enable signal OE* is equal to $V_{CC}-V_{BE}$. If internal chip select signal CSC is a logic high and internal write enable signal WEC* is a logic high, (indicating a read cycle) NAND gate 173 provides a logic low to the input terminal of inverter 174, and in response a logic high is provided at the output terminal of inverter 174. P-channel transistor 172 becomes non-conductive and N-channel transistor 171 becomes conductive, so that output enable signal OE* is equal to $V_{CC}-2.5V_{BE}$.

In order to provide a voltage equal to $V_{CC}-2.5V_{BE}$ during a read cycle of memory 20, transistors 160 and 167 each provides a one $V_{BE}$ drop. The additional one-half $V_{BE}$ is provided across resistor 161 by adjusting the resistance ratios of resistors 161 and 162. A voltage across resistor 161, designated $V_{161}$, is equal to $V_{162} \times R_{161}/R_{162}$, where $R_{162}$ is equal to the resistance of resistor 162 and $V_{162}$ is the voltage across resistor 162. The voltage drop across $R_{162}$ is equal to one $V_{BE}$, therefore, for $V_{161}$ to be equal to approximately one-half $V_{BE}$, the ratio of $R_{161}$ to $R_{162}$ should equal about one-half.

To ensure an adequate noise margin, output enable circuit 74 should "track" the noise on differential data signals DATA and DATA*, so that output enable signal OE* is approximately at the midpoint of the common mode swing of differential data signals DATA and DATA*. Output enable circuit 74 tracks the noise caused by temperature and power supply variations by including circuit components that match the characteristics of other circuit components to track the noise. For example, NPN transistor 167 of output enable circuit 74 has the same layout size and shape as transistors 130 and 133 of data output multiplexer emitter-follower portion 129 (FIG. 4). Also, transistor 168 is provided to match the characteristics of transistors 131 and 134 as illustrated in FIG. 4. In addition, transistor 164 is provided to match the characteristics of transistors 120 and 123, and transistor 163 is provided to match the characteristics of transistors 121 and 122 of global data line load circuit 119 (FIG. 3). Finally, transistor 165 is provided to match the characteristics of the pass transistors of data output multiplexers 67 and 68 of FIG. 1.

While the invention has been described in the context of a preferred embodiment, it will be apparent to those skilled in the art that the present invention may be modified in numerous ways and may assume many embodiments other than that specifically set out and described above. For example, other types of reference and bias voltage circuits may be substituted for those illustrated. Accordingly, it is intended by the appended claims to cover all modifications of the invention which fall within the true spirit and scope of the invention.

We claim:

1. An integrated circuit memory having a write cycle, indicated by a write enable signal being in a first logic state, for writing data into a selected memory cell via a selected bit line pair, and a read cycle, indicated by the write enable signal being in a second logic state, for reading data provided onto a selected bit line pair, comprising:

common mode voltage means for providing a first common mode voltage in response to said write enable signal being in said first logic state, and for providing a second common mode voltage when said write enable signal is in said second logic state;

control means for providing an output enable signal at a first voltage level when said write enable signal is in said first logic state and for providing said output enable signal at a second voltage level that is characterized as being between said first and second common mode voltages when said write enable signal is in said second logic state; and data output buffer, means coupled to said common mode voltage means and said control means, and in response to receiving said first common mode voltage and said output enable signal at said first voltage level, providing a single-ended output signal at a third voltage level, and in response to receiving first and second differential data signals corresponding to data from a selected memory cell, said first and second differential data signals being characterized as relatively small complementary data signals superimposed on said second common mode voltage and said output enable signal at said second voltage level, providing a single-ended output data signal corresponding to said first and second differential data signals.

2. The memory of claim 1, wherein said first common mode voltage is substantially equal to a first power supply voltage minus two base-emitter diode voltage drops and said second common mode voltage is substantially equal to said first power supply voltage minus three base-emitter diode voltage drops.

3. The memory of claim 1, wherein said second voltage level is substantially midway between said first and second common mode voltages.

4. The memory of claim 1, wherein said first voltage level is substantially equal to a first power supply voltage minus one base-emitter diode voltage drop, and said second voltage level is substantially equal to said first power supply voltage minus two and one-half base-emitter diode voltage drops.

5. The memory of claim 2, wherein said control means comprises:

logic means for providing a control signal in response to receiving said write enable signal being in said second logic state;

a first resistor having a first terminal coupled to said first power supply voltage terminal and a second terminal;

a second resistor having a first terminal coupled to said second terminal of said first resistor and a second terminal;

a first bipolar transistor having a collector coupled to said first power supply voltage terminal, a base coupled to said second terminal of said first resistor, and an emitter coupled to said second terminal of said second resistor;

a second bipolar transistor having a collector coupled to said first power supply voltage terminal, a base coupled to said emitter of said first bipolar transistor, and an emitter;

a first N-channel transistor having a drain coupled to said emitter of said first bipolar transistor, a gate for receiving a first bias voltage, and a source coupled to a second power supply voltage terminal;

a second N-channel transistor having a drain coupled to said emitter of said second bipolar transistor, a gate for receiving said first bias voltage, and a source coupled to said second power supply voltage terminal;

a first P-channel transistor having a first drain/source terminal for receiving a first voltage, a gate for receiving said control signal and a second drain/source terminal for providing said output enable signal at said first voltage level in response to said write enable signal being at said first logic state; and a third N-channel transistor having a first drain/source terminal coupled to said emitter of said second bipolar transistor, a gate coupled to said gate of said first P-channel transistor, and a second drain/source terminal coupled to said second drain/source terminal of said first P-channel transistor for providing said output enable signal at said second voltage level in response to said write enable signal being at said second logic state.

6. The memory of claim 5, wherein the resistance ratio of said first resistor to said second resistor is substantially equal to one-half.

7. The memory of claim 5, wherein said first voltage is substantially equal to said first power supply voltage less one base-emitter diode voltage drop.

8. The memory of claim 5, wherein said first power supply voltage is equal to substantially zero volts, and said second power supply voltage is substantially equal to a negative voltage.

9. The memory of claim 5, wherein said data output buffer means comprises:

a third resistor having a first terminal coupled to said first power supply voltage terminal and a second terminal;

a fourth resistor having a first terminal coupled to said first power supply voltage terminal and a second terminal;

a third bipolar transistor having a collector coupled to said second terminal of said third resistor, a base for receiving said first differential data signal, and an emitter;

a fourth bipolar transistor having a collector coupled to said second terminal of said fourth resistor, a base for receiving said second differential data signal, and an emitter coupled to said emitter of said third bipolar transistor;

a fifth bipolar transistor having a collector coupled to said emitters of said third and fourth bipolar transistors, a base for receiving a second bias voltage, and an emitter;

a fifth resistor having a first terminal coupled to said emitter of said fifth bipolar transistor, and a second terminal coupled to said second power supply voltage terminal;

a sixth bipolar transistor having a collector coupled to said collector of said fourth bipolar transistor, a base for receiving said output enable signal, and an emitter coupled to said emitter of said fourth bipolar transistor; and a seventh bipolar transistor having a collector coupled to said first power supply voltage terminal, a base coupled to said collectors of said fourth and sixth bipolar transistors, and an emitter for providing said single-ended data signal.

10. An integrated circuit memory having a write cycle, indicated by a write enable signal being in a first logic state, for writing data into a selected memory cell via a selected bit line pair, and a read cycle, indicated by the write enable signal being in a second logic state, for reading data provided onto a selected bit line pair, comprising:

a plurality of memory cells coupled to word lines and bit line pairs, each memory cell for receiving data from the bit line pair to which it is coupled, when the word line to which it is coupled is enabled;

a sense amplifying for sensing and amplifying data from a selected memory cell when said write enable signal is in said second logic state and in response, providing first and second differential data signals, said first and second differential data signals being superimposed on a first common mode voltage;

a global data line pair for providing first and second differential data signals corresponding to data from a selected memory cell when said write enable signal is in said second logic state;

a global data line load, coupled to said global data line pair, for providing a second common mode voltage to said global data line pair when said write enable signal is in said first logic state;

a data output multiplexer emitter-follower means for receiving said second common mode voltage and in response, providing a third common mode voltage level one base-emitter diode voltage drop less than said second common mode voltage, and for receiving said first and second differential data signals superimposed on said first common mode voltage and in response, providing said first and second differential data signals superimposed on a fourth common mode voltage one base-emitter diode voltage drop less than said first common mode voltage;

a data output enable control circuit for providing an output enable signal at a first voltage level when said write enable signal is in said first logic state and for providing said output enable signal at a second voltage level substantially at a midpoint between said third common mode voltage level and said fourth common mode voltage level when said write enable signal is in said second logic state; and a data output buffer, coupled to said data output multiplexer emitter-follower means and said data output enable control circuit, and in response to receiving said third common mode voltage and said output enable signal at said first voltage level, providing a single-ended output signal at a third voltage level, and in response to receiving said fourth common mode voltage and said output enable signal at said second voltage level, providing a single-ended output data signal corresponding to said first and second differential data signals.

11. The memory of claim 10, wherein said third common mode voltage level is substantially equal to a first power supply voltage minus two base-emitter diode voltage drops and said fourth common mode voltage level is substantially equal to said first power supply voltage minus three base-emitter diode voltage drops.

12. The memory of claim 11, wherein said first voltage level is substantially equal to a first power supply voltage minus one base-emitter diode voltage drop, and said second voltage level is substantially equal to said first power supply voltage minus two and one-half base-emitter diode voltage drops.

13. The memory of claim 11, wherein said data output enable control circuit comprises:

logic means for providing a control signal in response to receiving said write enable signal being in said second logic state;

a first resistor having a first terminal coupled to said first power supply voltage terminal and a second terminal;

a second resistor having a first terminal coupled to said second terminal of said first resistor and a second terminal;

a first bipolar transistor having a collector coupled to said first power supply voltage terminal, a base coupled to said second terminal of said first resistor, and an emitter coupled to said second terminal of said second resistor;

a second bipolar transistor having a collector coupled to said first power supply voltage terminal, a base coupled to said emitter of said first bipolar transistor, and an emitter;

a first N-channel transistor having a drain coupled to said emitter of said first bipolar transistor, a gate for receiving a first bias voltage, and a source coupled to a second power supply voltage terminal;

a second N-channel transistor having a drain coupled to said emitter of said second bipolar transistor, a gate for receiving said first bias voltage, and a source coupled to said second power supply voltage terminal;

a first P-channel transistor having a first drain/source terminal for receiving a first voltage, a gate for receiving said control signal and a second drain/source terminal for providing said output enable signal at said first voltage level in response to said write enable signal being at said first logic state;

a third N-channel transistor having a first drain/source terminal coupled to said emitter of said second bipolar transistor, a gate coupled to said gate of said first P-channel transistor, and a second drain/source terminal coupled to said second drain/source terminal of said first P-channel transistor for providing said output enable signal at said second voltage level in response to said write enable signal being at said second logic state; and tracking means for ensuring that said second voltage level remains at the midpoint of said third and fourth common mode voltage levels.

14. The memory of claim 13, wherein the resistance ratio of said first resistor to said second resistor is substantially equal to one-half.

15. The memory of claim 13, wherein said first power supply voltage is equal to substantially zero volts, and said second power supply voltage is equal to a negative voltage.

16. The memory of claim 13, wherein said data output buffer comprises:

a third resistor having a first terminal coupled to said first power supply voltage terminal and a second terminal;

a fourth resistor having a first terminal coupled to said first power supply voltage terminal and a second terminal;

a third bipolar transistor having a collector coupled to said second terminal of said third resistor, a base for receiving said first differential data signal, and an emitter;

a fourth bipolar transistor having a collector coupled to said second terminal of said fourth resistor, a base for receiving said second differential data signal, and an emitter coupled to said emitter of said third transistor;

a fifth bipolar transistor having a collector coupled to said emitters of said third and fourth bipolar transistors, a base for receiving a second bias voltage, and an emitter;

a fifth resistor having a first terminal coupled to said emitter of said fifth bipolar transistor, and a second terminal coupled to said second power supply voltage terminal;

a sixth bipolar transistor having a collector coupled to said collector of said fourth bipolar transistor, a base for receiving said output enable signal, and an emitter coupled to said emitter of said fourth bipolar transistor; and a seventh bipolar transistor having a collector coupled to said first power supply voltage terminal, a base coupled to said collectors of said fourth and sixth bipolar transistors, and an emitter for providing said single-ended data signal.

17. The memory of claim 16, wherein said second bias voltage is characterized as a bandgap controlled bias voltage.

18. In an integrated circuit memory having a write cycle, indicated by a write enable signal being in a first logic state, for writing data into a selected memory cell via a selected bit line pair, and a read cycle, indicated by the write enable signal being in a second logic state, for reading data provided onto a selected bit line pair, a method for enabling a data output buffer, comprising the steps of:

providing a first common mode voltage in response to said write enable signal being in said first logic state, and providing a second common mode voltage when said write enable signal is in said second logic state;

providing an output enable signal at a first voltage level when said write enable signal is in said first logic state, and providing said output enable signal at a second voltage level that is characterized as being between said first and second common mode voltages when said write enable signal is in said second logic state;

amplifying data from a selected memory cell in response to said write enable signal being in said second logic state and providing first and second differential data signals corresponding to said amplified data;

superimposing said first and second differential data signals corresponding to said amplified data on said second common mode voltage; and providing a single-ended data signal corresponding to said first and second differential data signals in response to said output enable signal being at said second voltage level.

19. The method of claim 18, wherein said step of providing an output enable signal at a first voltage level comprises providing said output enable signal substantially equal to a first power supply voltage minus one base-emitter diode voltage drop, and said step of providing said output enable signal at a second voltage level comprises providing said output enable signal substantially equal to said first power supply voltage minus two and one-half base-emitter diode voltage drops.

20. The method of claim 18, wherein said step of providing a first common mode voltage comprises providing a first common mode voltage substantially equal to a first power supply voltage minus two base-emitter diode voltage drops, and said step of providing a second common mode voltage level comprises providing a second common mode voltage equal to said first power supply voltage minus three base-emitter diode voltage drops.

* * * * *